(12) United States Patent
Arakawa

(10) Patent No.: US 12,027,217 B2
(45) Date of Patent: Jul. 2, 2024

(54) SEMICONDUCTOR DEVICE AND OPERATION METHOD HAVING POWER-ON OPERATION

(71) Applicant: Winbond Electronics Corp., Taichung (TW)

(72) Inventor: Kenichi Arakawa, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 213 days.

(21) Appl. No.: 17/724,499

(22) Filed: Apr. 20, 2022

(65) Prior Publication Data

US 2022/0359018 A1   Nov. 10, 2022

(30) Foreign Application Priority Data

May 6, 2021   (JP) .................................. 2021-078583

(51) Int. Cl.
*G11C 16/04*   (2006.01)
*G11C 16/30*   (2006.01)

(52) U.S. Cl.
CPC .................................. *G11C 16/30* (2013.01)

(58) Field of Classification Search
CPC ......... G11C 16/30; G11C 16/225; G11C 5/14; G11C 5/144; G11C 5/148
USPC .................................................... 365/185.27
See application file for complete search history.

(56) References Cited

U.S. PATENT DOCUMENTS

| | | | | |
|---|---|---|---|---|
| 5,659,517 A | * | 8/1997 | Arimoto | G11C 5/147 365/228 |
| 6,828,834 B2 | * | 12/2004 | Sivero | G05F 1/465 327/143 |
| 2005/0117406 A1 | * | 6/2005 | Atsumi | G11C 7/1045 365/189.05 |
| 2005/0152202 A1 | * | 7/2005 | Choi | G11C 5/145 365/226 |
| 2011/0188303 A1 | | 8/2011 | Cho et al. | |

FOREIGN PATENT DOCUMENTS

| | | |
|---|---|---|
| CN | 107611050 | 1/2018 |
| TW | 512352 | 12/2002 |
| TW | 535161 | 6/2003 |

* cited by examiner

*Primary Examiner* — Tha-O H Bui
(74) *Attorney, Agent, or Firm* — JCIPRNET

(57) ABSTRACT

A semiconductor device and an operation method capable of operating with high reliability are provided. A voltage monitoring circuit (100) of the disclosure includes: a power-on detection part (110) configured to detect whether a supply voltage (EXVDD) of an external power supply terminal has reached a power-on voltage level; a timer (120) configured to measure a predetermined time when the power-on voltage level is detected; a through current generation part (130) configured to generate a through current between the external power supply terminal and GND during a period when the timer (120) measures the predetermined time; and a power-off detection part (140) configured to detect whether a drop of the supply voltage (EXVDD) has reached a power-off voltage level when the through current is generated.

14 Claims, 6 Drawing Sheets

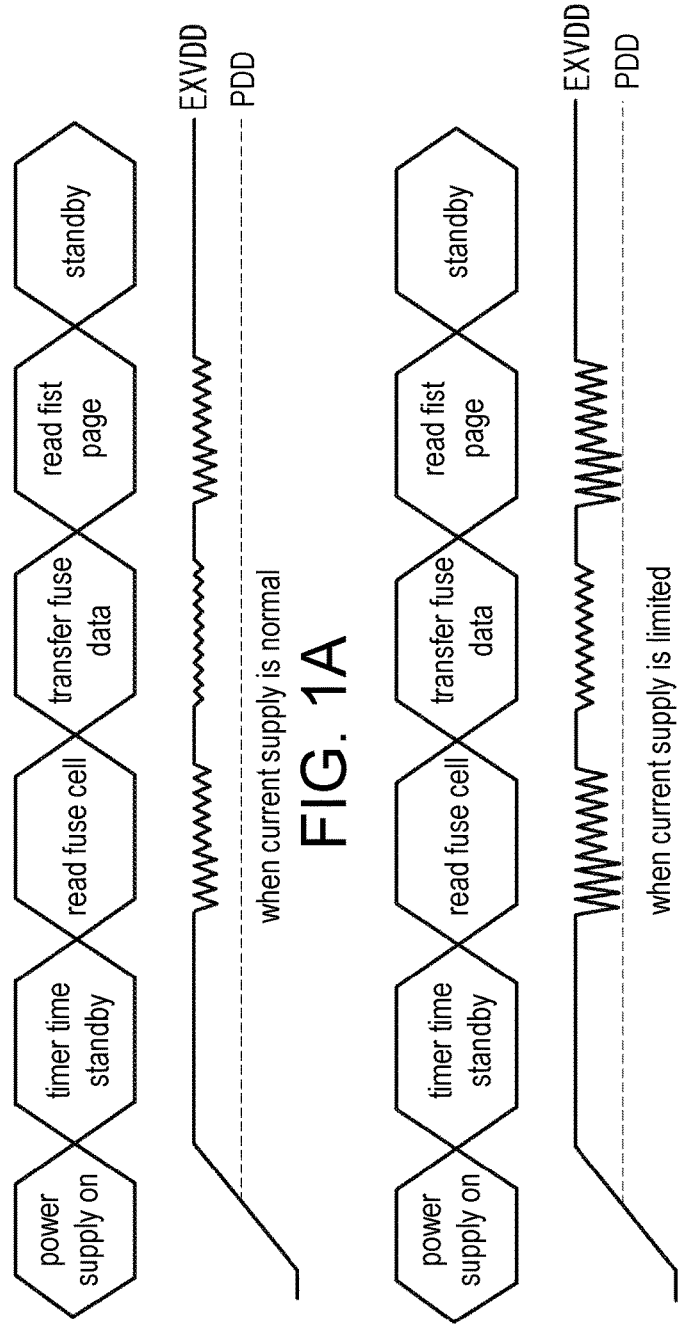
FIG. 1A
FIG. 1B
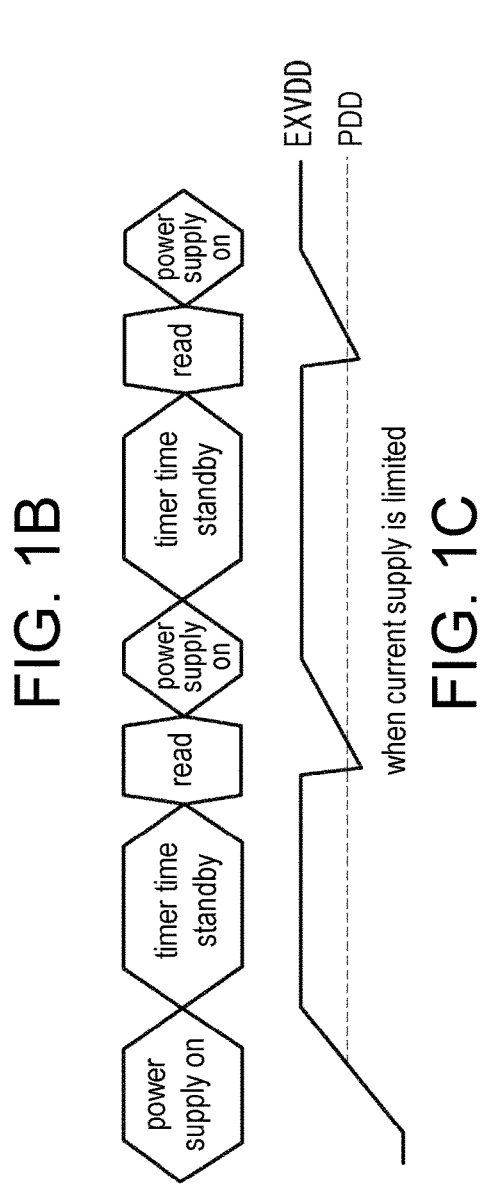
FIG. 1C

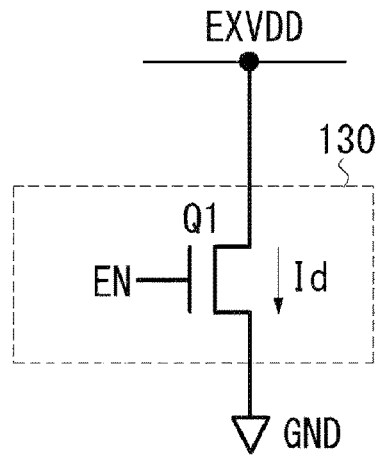
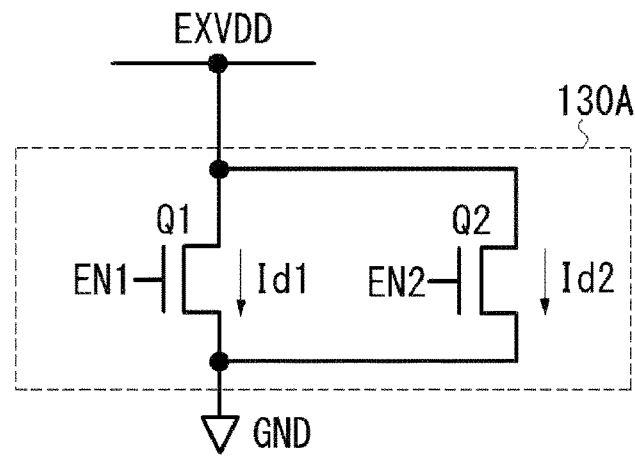
FIG. 4A          FIG. 4B
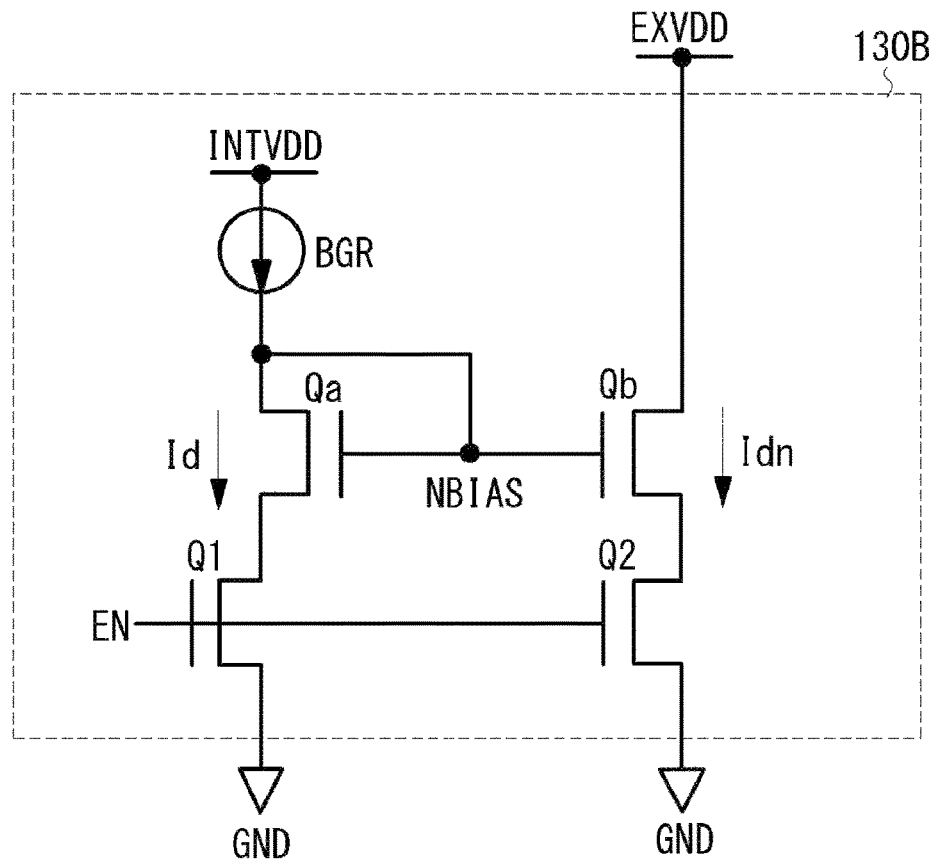
FIG. 5

SEMICONDUCTOR DEVICE AND OPERATION METHOD HAVING POWER-ON OPERATION

CROSS-REFERENCE TO RELATED APPLICATION

This application claims the priority benefit of Japanese application serial no. 2021-078583, filed on May 6, 2021. The entirety of the above-mentioned patent application is hereby incorporated by reference herein and made a part of this specification.

BACKGROUND

Technical Field

The disclosure relates to a semiconductor device such as a flash memory, and more particularly relates to a power-on operation when the power is turned on.

Description of Related Art

A NAND flash memory is used to store setting information such as the operating voltage, timing, and internal voltage for reading, programming, erasing, etc. in a fuse cell, and when the power is turned on, as a power-on operation, the setting information stored in the fuse cell is read out and loaded into a register of a peripheral circuit. After the power-on operation, a controller refers to the setting information set in the register to control various operations.

FIG. 1A is a timing chart for illustrating the power-on operation when the power is turned on for the flash memory. When the power is turned on and the supply voltage EXVDD of an external power supply terminal rises to the power-on voltage level, an internal timer is activated to measure a predetermined time. The supply voltage EXVDD stabilizes after the predetermined time passes, and then the setting information is read from the fuse cell. The fuse cell is provided in an area of the memory array that is not used by the user, and the reading of the fuse cell is performed automatically without using a command during the power-on operation.

The reading of the fuse cell may be performed by the controller reading an instruction code or the like stored in the read only memory. When reading the fuse cell, a charge pump is activated in order to generate a read path voltage or precharge voltage. The charge pump boosts the voltage in synchronization with a clock and consumes a relatively large pump current before the operation stabilizes. Since the pump current occupies most of the consumption current Icc during the reading operation of the fuse cell, when the charge pump operates, the supply voltage EXVDD temporarily drops or fluctuates greatly.

After reading the fuse cell, the read setting information is transferred to the register, and then redundant information or the like is read from the first page of the memory array. In this way, the power-on operation is ended, and the flash memory enters a standby state.

There are situations in which the operating environment of the flash memory is not always stable. For example, when the current supply from the external power supply terminal is insufficient, fluctuation and noise of the supply voltage EXVDD become large, which may result in incorrect reading of the fuse cell and cause incorrect setting information to be set in the register.

FIG. 1B shows the power-on operation when the current supplied from the external power supply terminal is limited. As shown in the figure, in the reading operation of the fuse cell, the supply voltage EXVDD drops close to the power-off voltage level PDD due to the large current consumption of the internal circuit such as the charge pump. Since the supply voltage EXVDD is quite low at this time, it may result in incorrect reading of the fuse cell.

FIG. 1C shows another power-on operation when the current supplied from the external power supply terminal is limited. As shown in the figure, in the reading operation of the fuse cell, the supply voltage EXVDD drops below the power-off voltage level PDD due to the large current consumption of the internal circuit such as the charge pump. When the power-off voltage level is reached, the flash memory stops the charge pump and resets the CPU or the logic, and interrupts the reading of the fuse cell. After that, power is turned on for the flash memory again, and when the supply voltage reaches the power-on voltage level and the predetermined time passes, the fuse cell is read again. As shown in the figure, if the supply voltage EXVDD continues to drop below the power-off voltage level PDD due to the consumption current of the operating environment of the charge pump, the power-on operation and the power-off operation are repeated. Since the fuse cell is read and interrupted repeatedly, the register may store incorrect setting information therein, which may lead to an incorrect operation of the memory. In addition, when the power-on operation and the power-off operation are repeated, even though the chip is inaccessible, part of the fuse cell is read intermittently. Such a reading operation gives unnecessary stress to the memory array and impairs the reliability of the subsequent operation.

SUMMARY

An operation method of a semiconductor device according to the disclosure includes: monitoring a supply voltage of an external power supply terminal and detecting a power-on voltage level; measuring a predetermined time in response to detecting the power-on voltage level; generating a through current between the external power supply terminal and a reference potential during a period of measuring the predetermined time; and detecting a drop of the supply voltage when generating the through current.

A semiconductor device according to the disclosure includes a power-on detection mechanism, a measurement mechanism, a through current generation mechanism, and a voltage drop detection mechanism. The power-on detection mechanism detects that a supply voltage of an external power supply terminal reaches a power-on voltage level. The measurement mechanism measures a predetermined time when detecting that the supply voltage reaches the power-on voltage level. The through current generation mechanism generates a through current between the external power supply terminal and a reference potential when the measurement mechanism measures the predetermined time. The voltage drop detection mechanism detects whether a drop of the supply voltage reaches a power-off voltage level when the through current is generated.

According to the disclosure, the through current is generated between the external power supply terminal and the reference potential during the predetermined time measured by the timer after the supply voltage reaches the power-on voltage level, and the through current may be set according to the consumption current of the operating environment (for example, the consumption current of the charge pump in FIGS. 1B and 1C). Therefore, when the current supplied from the external supply terminal is insufficient, the power-on operation of the semiconductor device can be stopped before the reading operation of the fuse cell, thereby avoiding an error in the setting information read from the fuse cell to the register.

BRIEF DESCRIPTION OF THE DRAWINGS

FIGS. 1A to 1C are timing charts for respectively illustrating the power-on operation of the conventional flash memory.

FIGS. 4A and 4B are diagrams respectively showing the configuration of the through current generation part according to an embodiment of the disclosure.

FIG. 5 is a diagram showing the configuration of the through current generation part according to an embodiment of the disclosure.

DETAILED DESCRIPTION OF DISCLOSED EMBODIMENTS

A semiconductor device according to the disclosure is, for example, a NAND flash memory or a microprocessor, a microcontroller, a logic, an ASIC, a processor that processes images and sounds, a processor that processes signals such as wireless signals, etc. in which such a flash memory is embedded. In the following description, a NAND flash memory will be illustrated.

Figure 2:
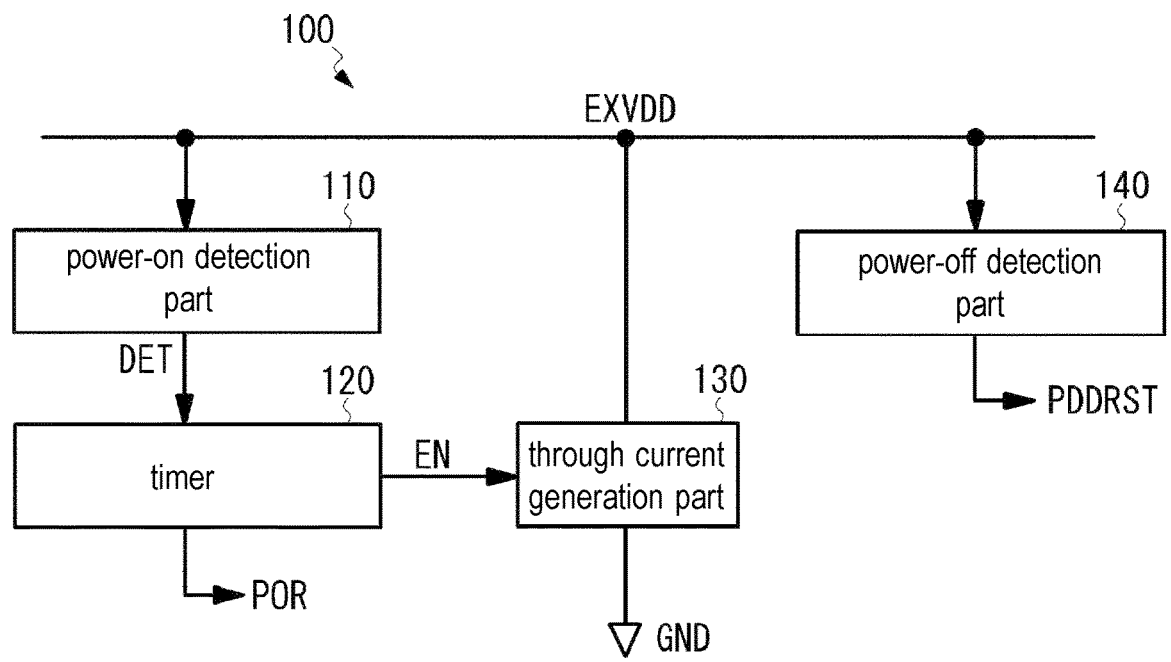
FIG. 2 is a diagram showing the configuration of the voltage monitoring circuit that performs the power-on operation of the semiconductor device according to an embodiment of the disclosure.

FIG. 2 is a diagram showing the configuration of a voltage monitoring circuit according to an embodiment of the disclosure. The voltage monitoring circuit 100 of this embodiment has a function of monitoring the supply voltage EXVDD supplied from the external power supply terminal of the semiconductor device, and includes a power-on detection part 110, a timer 120, a through current generation part 130, and a power-off detection part 140.

The power-on detection part 110 is configured to detect whether the supply voltage EXVDD of the external power supply terminal reaches the power-on voltage level, and provide the detection signal DET that indicates the detection result to the timer 120 when detecting that the supply voltage EXVDD reaches the power-on voltage level.

Figure 3:
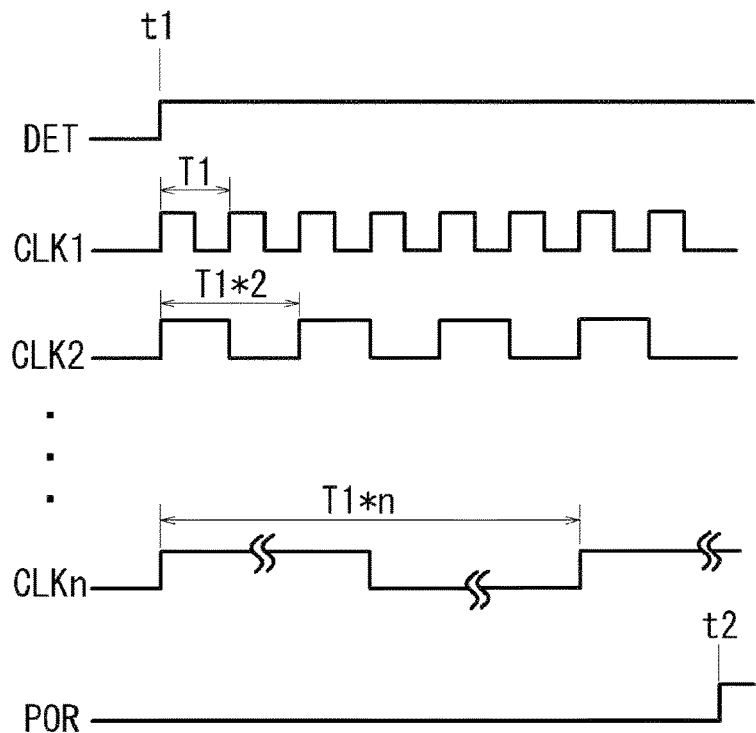
FIG. 3 is a diagram illustrating the configuration of the timer shown in FIG. 2.
Figure 3:
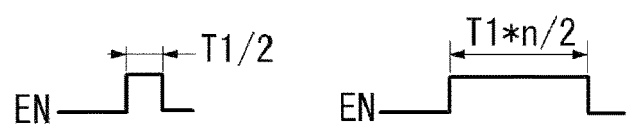

The timer 120 measures a predetermined time until the supply voltage EXVDD stabilizes in response to the detection signal DET. The timer 120 includes, for example, a counter for counting clocks, and measures the time by counting the clocks. As shown in FIG. 3, the timer 120 inputs the minimum reference clock CLK1 (cycle=T1), generates clocks CLK2, CLK3, . . . , CLKn obtained by multiplying the clock CLK1, and measures a desired predetermined time by these clocks.

As shown in the figure, the timer 120 starts the measurement from the time t1 when the detection signal DET output by the power-on detection part 110 changes to the H level, ends the measurement at the time t2 when the predetermined time passes, and outputs the measurement end signal POR indicating that the supply voltage EXVDD reaches the H level stably. Then, the internal circuit starts to operate in response to the measurement end signal POR.

Further, the timer 120 may include a logic circuit (not shown) for generating the enable signal EN for driving the through current generation part 130 according to the clocks CLK1 to CLKn for time measurement. For example, the logic circuit may generate the enable signal EN having a pulse width (T1/2) by using the clock CLK1, or generate the enable signal EN having a pulse width (T1*n/2) by using the clock CLKn. Further, the logic circuit may generate a plurality of enable signals having different pulse widths by combining a plurality of clocks, or generate an enable signal having a plurality of pulses. It should be noted that the period in which the enable signal EN drives the through current generation part 130 is very short as compared with the predetermined time (T2−T1) in which the timer 120 measures the stability of the supply voltage EXVDD.

The through current generation part 130 generates a through current path in response to the enable signal EN between the external power supply terminal and the reference potential GND. FIG. 4A shows an example of the through current generation part 130. The through current generation part 130 includes a NMOS transistor Q1 connected between the external power supply terminal and GND, and the enable signal EN is connected to the gate of the transistor Q1. When the transistor Q1 is turned on through the enable signal EN, the drain current Id is discharged from the supply voltage EXVDD to the reference potential GND.

Further, as shown in FIG. 4B, the through current generation part 130 may generate a plurality of parallel through current paths between the external power supply terminal and the reference potential GND. As shown in the figure, the through current generation part 130A includes: a NMOS transistor Q1 connected in parallel between the external power supply terminal and GND and driven by the enable signal EN1; and a NMOS transistor Q2 driven by the enable signal EN2. The transistor Q1 allows the drain current Id1 to pass when driven by the enable signal EN1, and the transistor Q2 allows the drain current Id2 to pass when driven by the enable signal EN2, thereby discharging the drain current (through current) of Id1+Id2 from the supply voltage EXVDD toward GND. The through current Id1 and Id2 can be adjusted by respectively setting the pulse widths of the enable signals EN1 and EN2 or respectively setting the sizes of the transistors Q1 and Q2.

Further, as shown in FIG. 5, the through current generation part 130B may discharge a constant current by using a current mirror. The through current generation part 130B includes a constant current circuit BGR that generates a constant current which does not depend on the fluctuation of the internal supply voltage INTVDD, a transistor Qa that constitutes the current mirror, and a transistor Q1 that is driven by the enable signal EN between the internal supply voltage INTVDD and the reference potential GND, and further includes a transistor Qb that constitutes the current mirror and a transistor Q2 that is driven by the enable signal EN between the supply voltage EXVDD and the reference potential GND. The gates of the transistor Qa and the transistor Qb are commonly connected to the output of the constant current circuit BGR via the node NBIAS, and the transistor Qa and the transistor Qb are configured to have a current mirror ratio n. Thus, when the through current generation part 130B is driven by the enable signal EN, the drain current Idn generated by the current mirror is discharged from the supply voltage EXVDD toward the reference potential GND.

The power-off detection part 140 is configured to detect whether the supply voltage EXVDD drops to the power-off voltage level PDD, and output the reset signal PDDRST to the power-on detection part 110 or the through current generation part 130 of the internal circuit or the voltage monitoring circuit 100 when detecting that the supply voltage EXVDD drops to the power-off voltage level. When the internal circuit or the voltage monitoring circuit 100 receives the reset signal PDDRST, the clock generator or the like is stopped, or the register, the CPU, etc. are all reset.

Figure 6A:
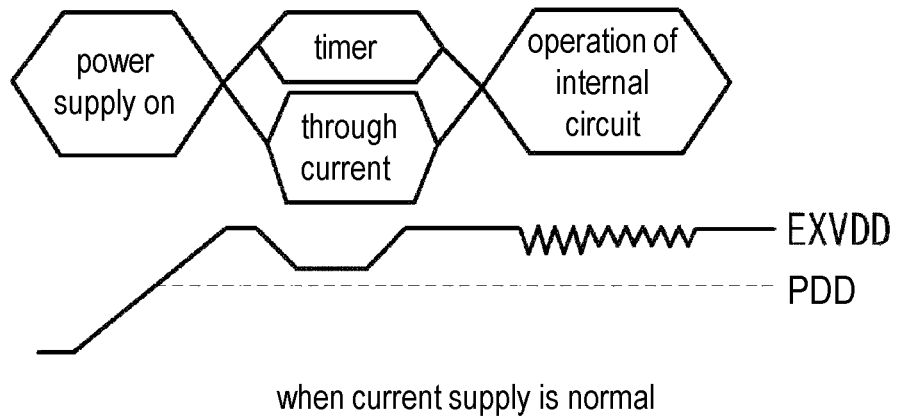
FIGS. 6A and 6B are timing charts for respectively illustrating the operation of the voltage monitoring circuit according to an embodiment of the disclosure.
Figure 6B:
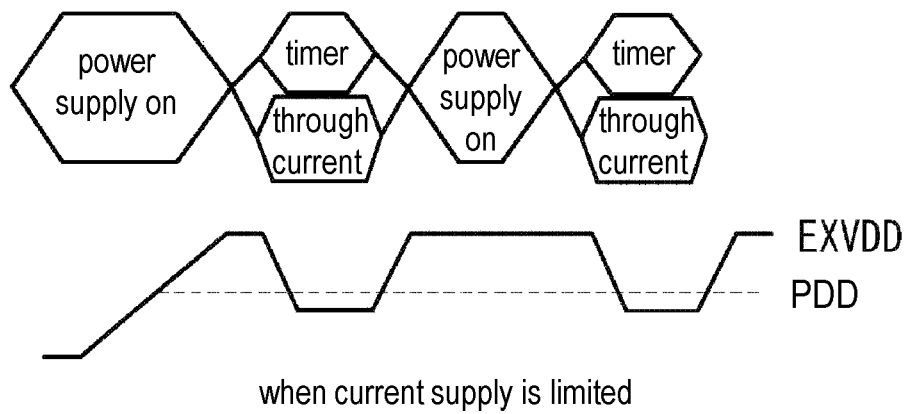

FIGS. 6A and 6B illustrate the operation of the voltage monitoring circuit of this embodiment. The through current is, for example, set to be substantially equal to the consumption current Icc of the internal circuit (Id≈Icc).

FIG. 6A shows the operation when the current Isp supplied from the external power supply terminal is sufficiently larger than the consumption current Icc when the internal circuit operates (Isp>>Icc). When the power is turned on, the supply voltage EXVDD of the external power supply terminal rises. When it is detected that the supply voltage EXVDD reaches the power-on voltage level, the timer 120 is activated, and at the same time, the through current flows from the supply voltage EXVDD toward GND. In this example, since the supply current Isp is sufficiently large, the supply voltage EXVDD drops due to the through current Id but does not drop to the power-off voltage level. Therefore, when the timer 120 ends the measurement of the predetermined time, the fuse cell can be read normally.

FIG. 6B shows the operation when the current Isp supplied from the external power supply terminal is limited. Similarly, when it is detected that the supply voltage EXVDD reaches the power-on voltage level, the timer 120 is activated, and at the same time, the through current Id flows from the supply voltage EXVDD toward GND. In this example, since the consumption current Icc of the internal circuit is relatively larger than the supply current Isp, when the through current Id flows, the supply voltage EXVDD drops to the power-off voltage level PDD during measurement of the predetermined time. The power-off detection part 140 outputs the reset signal PDDRST when detecting that the supply voltage EXVDD drops to the power-off voltage level PDD. In response to the reset signal PDDRST output from the power-off detection part 140, the power-on detection part 110, the timer 120, and the through current generation part 130 are reset. Thus, when the current Isp supplied from the external power supply terminal is limited, the through current Id substantially equal to the consumption current Icc flows during the period in which the timer 120 measures the predetermined time, so as to prevent the supply voltage EXVDD from dropping to the power-off voltage level PDD under the influence of the through current Id and thereby ensure that the reading of the fuse cell and the subsequent operation of the semiconductor device can be correctly performed to avoid an error after the measurement of the predetermined time.

The above embodiment illustrates an example in which the through current Id≈the consumption current Icc, but the through current Id may be set as Id=Icc+Im (Im is a margin that guarantees the operation of the semiconductor device). The margin Im may be set in consideration of, for example, the peak current when the internal circuit operates. For example, the margin Im may be set larger than the peak current.

The through current Id may also be used to detect the supply condition of the supply current Isp from the external power supply terminal. For example, in addition to the power-off detection part 140, a voltage drop detection part for detecting whether the supply voltage EXVDD drops below a voltage level Va to be monitored may be provided. Furthermore, the supply condition of the supply current Isp may be determined based on the detection result of the voltage drop detection part. The determination result may be stored in, for example, a flag so that the user can know the power environment in which the semiconductor device is placed with reference to the flag.

Figure 7:
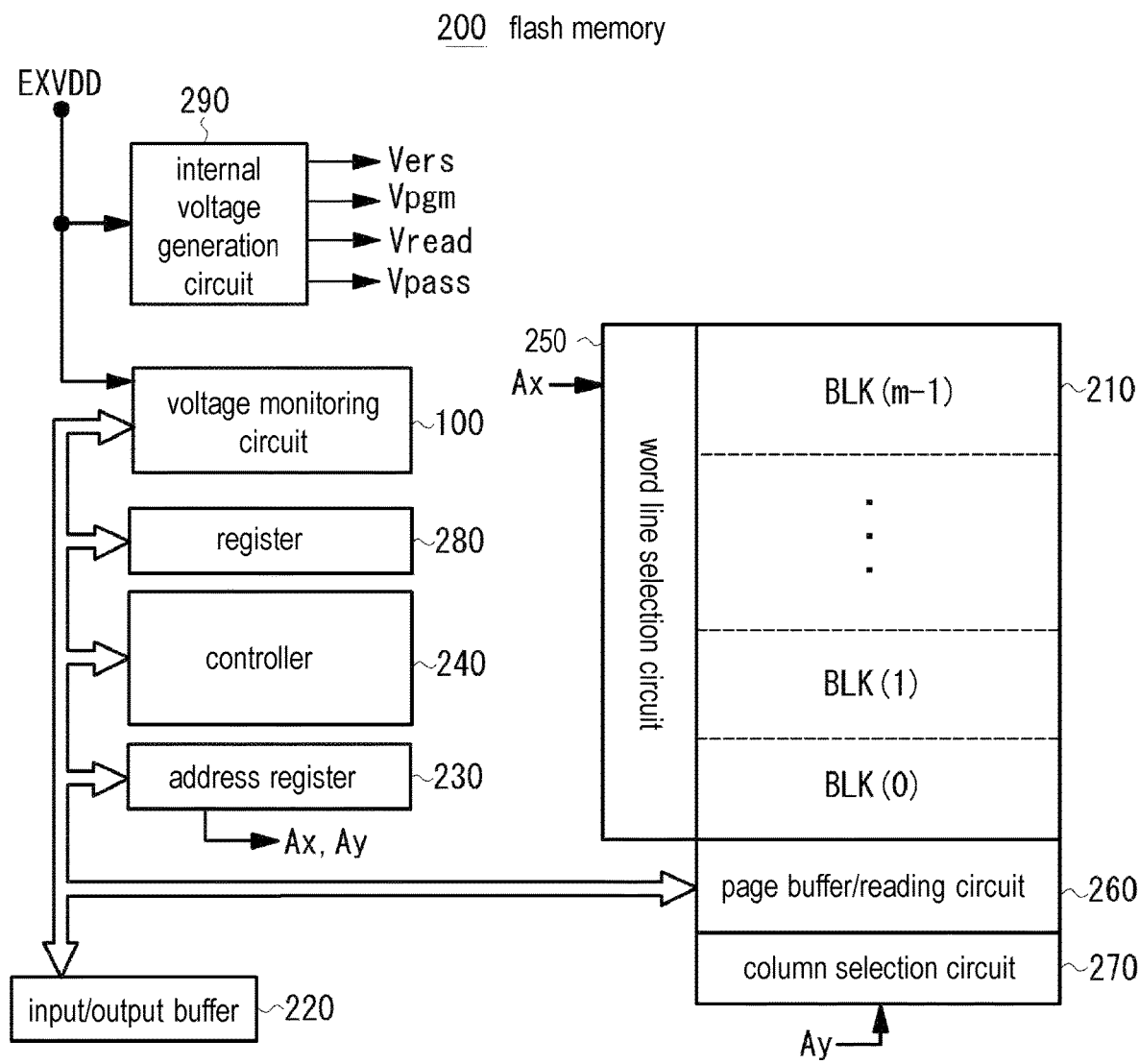
FIG. 7 is a diagram showing the configuration of the flash memory according to an embodiment of the disclosure.

Next, an example in which the voltage monitoring circuit 100 of this embodiment is applied to the flash memory will be described with reference to FIG. 7. As shown in the figure, the flash memory 200 includes: a memory array 210 in which a plurality of memories are formed; an input/output buffer 220 that is connected to the external input/output terminal; an address register 230 that receives address data from the input/output buffer 220; a controller 240 that receives command data from the input/output buffer 220 and controls each part; a word line selection circuit 250 that selects a block, a word line, etc. based on the row address information Ax from the address register 230; a page buffer/reading circuit 260 that holds the read data of the page selected by the word line selection circuit 250 and the program data to be programmed on the selected page; a column selection circuit 270 that selects a column of the page buffer/reading circuit 260 based on the column address information Ay from the address register 230; a register 280 that stores the setting information read from the fuse cell; the voltage monitoring circuit 100 that monitors the supply voltage EXVDD of the external power supply terminal; and an internal voltage generation circuit 290 that generates internal voltages such as the programming voltage Vpgm, the reading voltage Vread, the erasing voltage Vers, and the pass voltage Vpass.

The memory array 210 includes a plurality of blocks BLK (0, 1, . . . , m−1), and a plurality of NAND strings are formed in each block. In addition, in the memory array 110, the fuse cell for storing the setting information such as the operating voltage and timing is formed in an area that cannot be used by the user (or an inaccessible area). During the power-on operation, the controller 240 reads the setting information stored in the fuse cell and sets the setting information in the register 280.

The controller 240 includes, for example, a microcontroller such as a CPU or ROM/RAM, or a state machine. For example, the ROM stores programs for executing the power-on operation, the reading operation, the programming operation, the erasing operation, etc., and the controller 240 controls each operation by executing these programs.

In the reading operation, a positive voltage is applied to the bit line. For example, 0 V is applied to the selected word line, and a pass voltage is applied to the non-selected word line. In the programming operation, a high-voltage programming voltage Vpgm is applied to the selected word line, an intermediate potential is applied to the non-selected word line, and a voltage corresponding to the data of "0" or "1" is supplied to the bit line. In the erasing operation, 0 V is applied to the selected word line in the block, a high voltage is applied to the P well, and the data is erased in units of blocks.

Figure 8A:
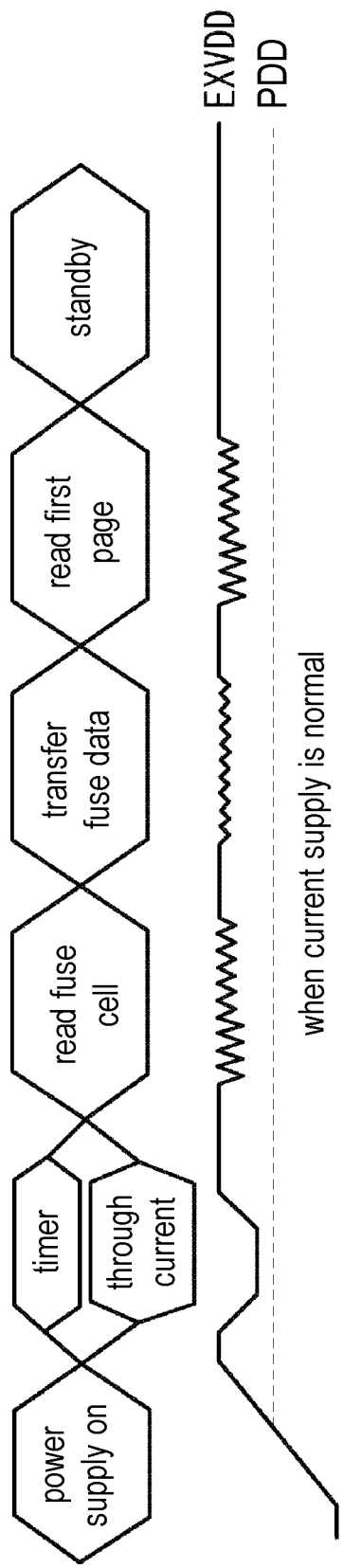
FIGS. 8A and 8B are timing charts for respectively illustrating the power-on operation when the voltage monitoring circuit is applied to the flash memory according to an embodiment of the disclosure.
Figure 8B:
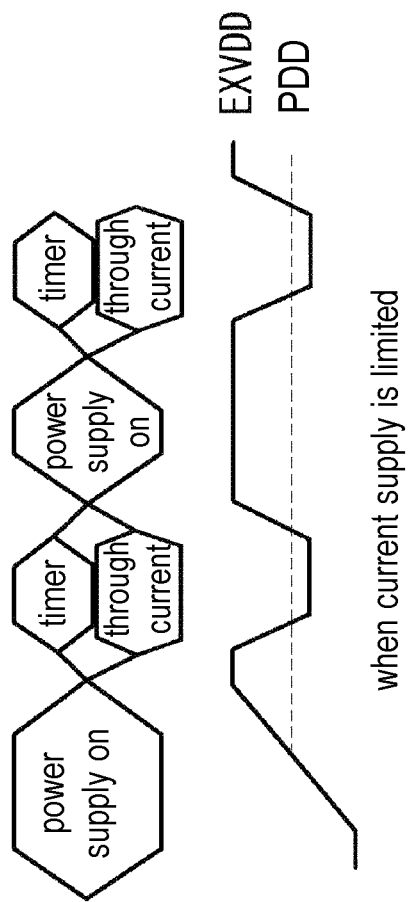

FIGS. 8A and 8B illustrate the power-on operation of the flash memory 200. The through current Id is, for example, set based on the consumption current Icc at the time of reading the memory array performed during the power-on operation (Id≈Icc). For example, the consumption current Icc may be set to a maximum current that can be reached in the reading operation, for example, the maximum current when the charge pump is activated.

FIG. 8A shows the state when the current Isp from the external power supply terminal is sufficiently large. Referring to FIG. 8A, when the power is turned on, the supply voltage EXVDD of the external power supply terminal rises. When the power-on detection part 110 of the voltage monitoring circuit 100 detects that the supply voltage EXVDD reaches the power-on voltage level, the timer 120 starts measurement of the predetermined time, and during the measurement, outputs the enable signal EN to the through current generation part 130. The through current generation part 130 generates the through current path between the supply voltage EXVDD and GND in response to the enable signal EN.

In this example, because Id≈Icc, when the supply current Isp is sufficiently large, the supply voltage EXVDD does not drop to the power-off voltage level PDD even with the through current Id passing through. Therefore, after the measurement of the timer 120 is ended, the controller 240 can normally read the setting information from the fuse cell of the memory array 210 and transfer the read setting information to the register 280. Further, if necessary, the controller 240 reads the redundant information or the like from the first page of the memory array 210. The fuse reading and first page reading may be preset as part of the power-on operation, and the controller 240 automatically performs these operations without an external command. After that, the flash memory enters the standby state.

FIG. 8B shows the state when the current Isp from the external power supply terminal is limited. As shown in the figure, when detecting that the supply voltage EXVDD reaches the power-on voltage level, the timer 120 starts the measurement and passes the through current, and therefore the supply voltage EXVDD drops to the power-off voltage level VDD. The power-off detection part 140 then detects that the supply voltage EXVDD drops to the power-off voltage level, and outputs the reset signal PDDRST. In response to the reset signal PDDRST, the internal circuit such as the timer 120, the power-on detection part 110 or the through current generation part 130 is reset, which prevents the flash memory 200 from entering the reading operation of the fuse cell in the state where the supply current Isp is limited, and thereby avoids an error. Furthermore, in this example, the reading operation of the fuse cell is not performed and interrupted repeatedly, which prevents giving unnecessary stress to the memory array and thereby improves the reliability of the memory.

Although the exemplary embodiments of the disclosure have been described in detail, the disclosure is not limited to the specific embodiments, and it is possible to make various modifications and changes within the scope of the gist of the disclosure defined in the claims.

What is claimed is:

1. An operation method of a semiconductor device, comprising:
    monitoring a supply voltage of an external power supply terminal and detecting a power-on voltage level;
    measuring a predetermined time in response to detecting the power-on voltage level;
    generating a through current between the external power supply terminal and a reference potential during a period of measuring the predetermined time; and
    detecting a drop of the supply voltage when generating the through current.

2. The operation method according to claim 1, wherein detecting the drop of the supply voltage comprises detecting whether the supply voltage reaches a power-off voltage level,
    wherein the operation method further comprises resetting the semiconductor device when detecting that the supply voltage reaches the power-off voltage level.

3. The operation method according to claim 1, wherein detecting the drop of the supply voltage comprises detecting whether the supply voltage reaches the power-off voltage level,
    wherein the operation method further comprises causing an internal circuit to perform a normal operation after the period of measuring the predetermined time when detecting that the supply voltage does not reach the power-off voltage level.

4. The operation method according to claim 3, wherein the normal operation is an operation of reading setting information related to an operation of the semiconductor device from a predetermined storage area.

5. The operation method according to claim 1, wherein generating the through current comprises controlling at least one of a value of the through current and a period during which the through current passes.

6. The operation method according to claim 5, wherein the controlling is performed by using at least one clock signal used in measuring the predetermined time.

7. The operation method according to claim 1, wherein generating the through current comprises generating the through current by using a constant current circuit.

8. A semiconductor device, comprising:
    a power-on detection mechanism configured to detect whether a supply voltage of an external power supply terminal reaches a power-on voltage level;
    a measurement mechanism configured to measure a predetermined time when detecting that the supply voltage reaches the power-on voltage level;
    a through current generation mechanism configured to generate a through current between the external power supply terminal and a reference potential during a period when the measurement mechanism measures the predetermined time; and
    a voltage drop detection mechanism configured to detect whether a drop of the supply voltage reaches a power-off voltage level when the through current is generated.

9. The semiconductor device according to claim 8, wherein the semiconductor device further comprises a reset mechanism configured to reset the semiconductor device when the voltage drop detection mechanism detects the power-off voltage level.

10. The semiconductor device according to claim 8, wherein the semiconductor device further comprises an implementation mechanism configured to cause an internal circuit to perform a normal operation after measurement of the predetermined time ends when the voltage drop detection mechanism does not detect that the supply voltage drops to the power-off voltage level.

11. The semiconductor device according to claim 10, wherein the normal operation is an operation of reading setting information related to an operation of the semiconductor device from a predetermined storage area.

12. The semiconductor device according to claim 9, wherein the through current generation mechanism controls at least one of a value of the through current and a period during which the through current passes.

13. The semiconductor device according to claim 12, wherein the through current generation mechanism controls the value of the through current and/or the period during which the through current passes by using a clock signal used in the measurement mechanism.

14. The semiconductor device according to claim 9, wherein the through current generation mechanism generates the through current by using a constant current circuit.

\* \* \* \* \*